United States Patent
Ribiere-Tharaud

(10) Patent No.: US 10,393,783 B2
(45) Date of Patent: Aug. 27, 2019

(54) DETECTION OF ULTRA WIDE BAND SIGNAL

(71) Applicant: Commissariat a L'Energie Atomique et aux Energies Alternatives, Paris (FR)

(72) Inventor: Nicolas Ribiere-Tharaud, Cavagnac (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/291,498

(22) Filed: Oct. 12, 2016

(65) Prior Publication Data

US 2017/0299642 A1   Oct. 19, 2017

(30) Foreign Application Priority Data

Oct. 14, 2015   (FR) ...................... 15 59754

(51) Int. Cl.
  *H04M 1/00*   (2006.01)
  *G01R 29/027*   (2006.01)
  (Continued)

(52) U.S. Cl.
  CPC ......... *G01R 29/0273* (2013.01); *G01R 23/18* (2013.01); *H01Q 5/25* (2015.01);
  (Continued)

(58) Field of Classification Search
  USPC ....................................................... 455/63.1
  See application file for complete search history.

(56) References Cited

U.S. PATENT DOCUMENTS

| 5,512,823 A | 4/1996 | Nepveu |
| 7,162,271 B2 * | 1/2007 | Kermalli ................. H04B 1/18 455/339 |

(Continued)

FOREIGN PATENT DOCUMENTS

| EP | 1 314 996 A2 | 5/2003 |
| EP | 1 542 027 A1 | 6/2005 |

(Continued)

OTHER PUBLICATIONS

French Preliminary Search Report dated Jun. 21, 2016 in French Application FR 15 59754 filed Oct. 14, 2015 (with English Translation of Categories of Cited Documents).

(Continued)

*Primary Examiner* — Lam S Nguyen
(74) *Attorney, Agent, or Firm* — Oblon, McClelland, Maier & Neustadt, L.L.P.

(57) ABSTRACT

A device for the detection of an ultra wide band signal, including a signal reception circuit, a signal divider circuit to divide the received signal into several frequency sub-bands, a circuit to determine the amplitude and duration of the received signal in each frequency sub-band, a circuit to compare the amplitude of the signal received in each frequency sub-band with an amplitude threshold, a circuit to compare the duration of the signal received in each frequency sub-band with a time threshold, and a decision circuit that determines that the received signal is of the ultra wide band type if the amplitude of the signal received in each frequency sub-band is higher than the amplitude threshold and if the duration of the signal received in each frequency sub-band is less than the time threshold.

11 Claims, 2 Drawing Sheets

(51) Int. Cl.
*H04B 1/7163* (2011.01)
*H04B 17/20* (2015.01)
*H01Q 5/25* (2015.01)
*H01Q 5/314* (2015.01)
*G01R 23/18* (2006.01)
*H01Q 9/02* (2006.01)
*G01R 29/08* (2006.01)
*H04B 17/21* (2015.01)
*H04B 17/23* (2015.01)

(52) U.S. Cl.
CPC ............ *H01Q 5/314* (2015.01); *H01Q 9/02* (2013.01); *H04B 1/71637* (2013.01); *H04B 17/20* (2015.01); *G01R 29/0814* (2013.01); *H04B 17/21* (2015.01); *H04B 17/23* (2015.01)

(56) References Cited

U.S. PATENT DOCUMENTS

| | | | |
|---|---|---|---|
| 9,462,798 | B2 | 10/2016 | Ribiere-Tharaud et al. |
| 2004/0048574 | A1* | 3/2004 | Walker ............... H03K 3/0315 455/63.1 |
| 2005/0179585 | A1 | 8/2005 | Walker et al. |
| 2007/0155348 | A1* | 7/2007 | Razavi ............... H04B 1/71635 455/118 |
| 2009/0164124 | A1 | 6/2009 | Ryan et al. |

FOREIGN PATENT DOCUMENTS

| | | |
|---|---|---|
| WO | WO 2008/100322 A2 | 8/2008 |
| WO | WO 2011/047377 A2 | 4/2011 |

OTHER PUBLICATIONS

Lei Feng, et al., "Fast Acquisition for Transmitted Reference Ultra-Wideband Systems with Channelized Receiver", Signals, Systems and Computers, IEEE, 2005, 5 pgs.

Christian Adami, et al., "HPM Detection System for Mobile and Stationary Use", Proc. of the 10$^{th}$ Int. Symposium on Electromagnetic Compatibility (EMC Europe 2011), 2011, 6 pgs.

Christian Adami, et al., "HPM detector system with frequency identification", Proc. of the 2014 International Symposium on Electromagnetic Compatibility (EMC Europe 2014), 2014, 6 pgs.

* cited by examiner

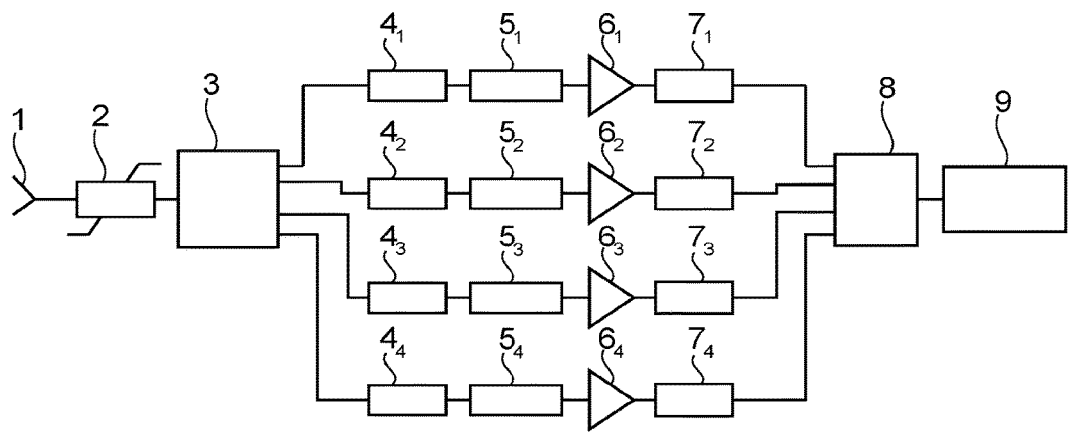
FIG. 2
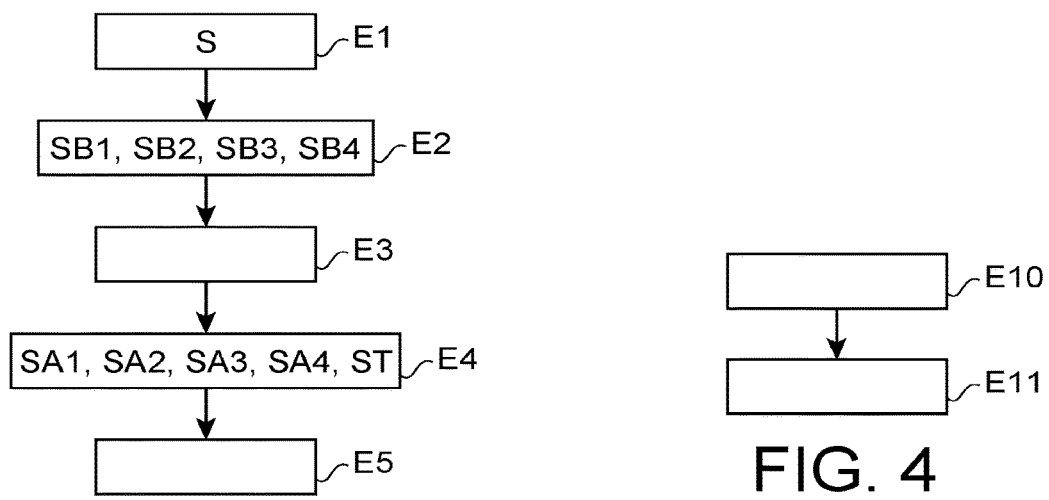
FIG. 3
FIG. 4

DETECTION OF ULTRA WIDE BAND SIGNAL

TECHNICAL FIELD

This invention relates to the safety of civil or military installations regarding ultra wide band UWB type electromagnetic constraints. It relates more particularly to the detection of radiofrequency signals with a very wide variety of wave shapes possibly with a very high amplitude. Such signals form electromagnetic aggression that can disturb or even destroy the electronics in these installations.

STATE OF PRIOR ART

The article entitled "HPM Detection System for Mobile and Stationary Use", by C. Adami et al., Proc. of the 10th Int. Symposium on Electromagnetic Compatibility (EMC Europe 2011), York, UK, Sep. 26-30, 2011, and the article entitled "HPM detector system with frequency identification" by C. Adami et al., Proc. of the 2014 International Symposium on Electromagnetic Compatibility (EMC Europe 2014), Gothenburg, Sweden, Sep. 1-4, 2014, relate to the detection of high power microwave (HPM) signals.

Electromagnetic disturbances detectors are described for example in WO 2008/100322 and WO 2011/047377.

These devices detect radiofrequency signals and measure their characteristics such as peak levels, durations or the aggression repetition rate. Aggressions are discriminated and an alarm can be generated.

However, these devices are incapable of detecting or discriminating ultra wide band signals. Their design is based on electronic components such as logarithmic amplifiers that are too slow. The response time of this type of component is not better than the order of 10 nanoseconds, while variations of ultra wide band signals characterising their disturbance capability are of the order of 0.1 nanoseconds, in other words one hundred times faster.

PRESENTATION OF THE INVENTION

The invention aims to solve problems with prior art by providing an ultra wide band signal detection device, characterised in that it comprises:

A signal reception circuit,
A signal divider circuit to divide the received signal into several frequency sub-bands,
A circuit to determine the amplitude and duration of the received signal in each frequency sub-band,
A circuit to compare the amplitude of the signal received in each frequency sub-band with an amplitude threshold,
A circuit to compare the duration of the signal received in each frequency sub-band with a time threshold, and
A decision circuit that determines that the received signal is of the ultra wide band type if the amplitude of the signal received in each frequency sub-band is higher than the amplitude threshold and if the duration of the signal received in each frequency sub-band is less than the time threshold.

Detection of ultra wide band signals is improved by the invention because it overcomes difficulties related to the response time of detection components such as a logarithmic amplifier.

The device according to the invention can function alone or networked, so that the source of detected ultra wide band signals can be located.

According to one preferred characteristic, the ultra wide signal detection device also comprises an alarm circuit to signal that the received signal is of the ultra wide band type.

According to one preferred characteristic, the ultra wide signal detection device also comprises a circuit to store the detected ultra wide band type signal. Thus, a data base collects data related to the detection of UWB type signals.

According to one preferred characteristic, the ultra wide signal detection device also comprises a circuit to determine the envelope of the signal received in each frequency sub-band. This envelope is processed to provide information used to discriminate a UWB signal.

According to one preferred characteristic, the ultra wide band signal detection device is adapted to implement a learning phase during which the detected ultra wide band type signals are stored as reference signals. Thus, the detection device according to the invention can function in a disturbed electromagnetic environment without generating any false alarms.

According to one preferred characteristic, the decision circuit is adapted to compare a detected ultra wide band signal with the reference signals. When the detected signal is similar to a reference signal, the detected signal does not generate an alarm.

The invention also relates to a method of detecting an ultra wide band signal, characterised in that it comprises the following steps:

signal reception,
division of the received signal into several frequency sub-bands,
determination of the amplitude and duration of the signal received in each frequency sub-band,
comparison of the amplitude of the signal received in each frequency sub-band with an amplitude threshold,
comparison of the duration of the signal received in each frequency sub-band with a time threshold, and
decision to determine that the received signal is of the ultra wide band type if the amplitude of the signal received in each frequency sub-band is higher than the amplitude threshold and if the duration of the signal received in each frequency sub-band is less than the time threshold.

The method has advantages similar to those mentioned above.

In one particular embodiment, the steps in the method according to the invention are implemented by the instructions in a computer program.

Consequently, the invention also relates to a computer program stored on a data medium, this program possibly being installed on a computer, this program including instructions adapted to implement the steps of a method like that described above.

This program can use any programming language and may be in the form of source code, object code or a code intermediate between source code and object code, such as a partially compiled form, or in any other desirable form.

The invention also relates to a data medium that can be read by a computer, containing computer program instructions adapted to implement the steps in a method like that described above.

The data medium may be any entity or device on which the program can be stored. For example, the medium may include a storage means such as a ROM, for example a CD ROM or a microelectronic circuit ROM, or a magnetic recording device such as for example a diskette or a hard disk.

The data medium may also be a transmissible medium such as an electrical or optical signal that can be routed on an electrical or optical cable, by radio or by other means. In particular, the program according to the invention can be downloaded on an Internet type network.

Alternately, the data medium can be an integrated circuit in which the program is included, the circuit being adapted to run or to be used for running the method according to the invention.

BRIEF DESCRIPTION OF THE DRAWINGS

Other characteristics and advantages will become clear after reading the following description of a preferred embodiment given as a non-limitative example, described with reference to the figures in which:

FIG. 2 represents an ultra wide band signal detection device according to one embodiment of the invention, FIG. 3 represents an ultra wide band signal detection method according to one embodiment of the invention, FIG. 4 represents a learning phase of the ultra wide band signal detection method according to one embodiment of the invention,

DETAILED PRESENTATION OF PARTICULAR EMBODIMENTS

Figure 1A:
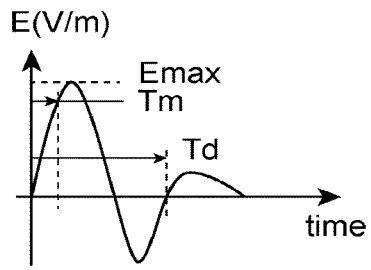
FIGS. 1a, 1b and 1c represent examples of ultra wide band signals to be detected.
Figure 1B:
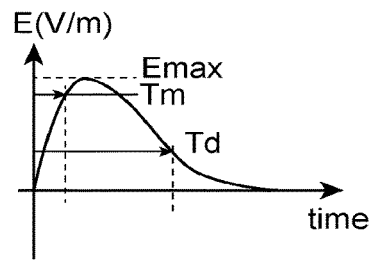

FIGS. 1a and 1b represent examples of signals to be detected. They are radio frequency signals, for which the amplitude in electric field as a function of time is shown. The signals to be detected are ultra wide band signals for which the shape in time is either bipolar (FIG. 1a), in other words they have a positive alternation and a negative alternation, or they are mono polar (FIG. 1b), in other words they have only a positive alternation.

In both cases, the rise time Tm is of the order of 0.1 nanosecond and the mean duration Td is of the order of 10 nanoseconds. The amplitude Emax of the ultra wide band signal can vary from a few V/m to several tens of kV/m, depending on the power of the signal source and the distance between the signal source and the detector.

Figure 1C:
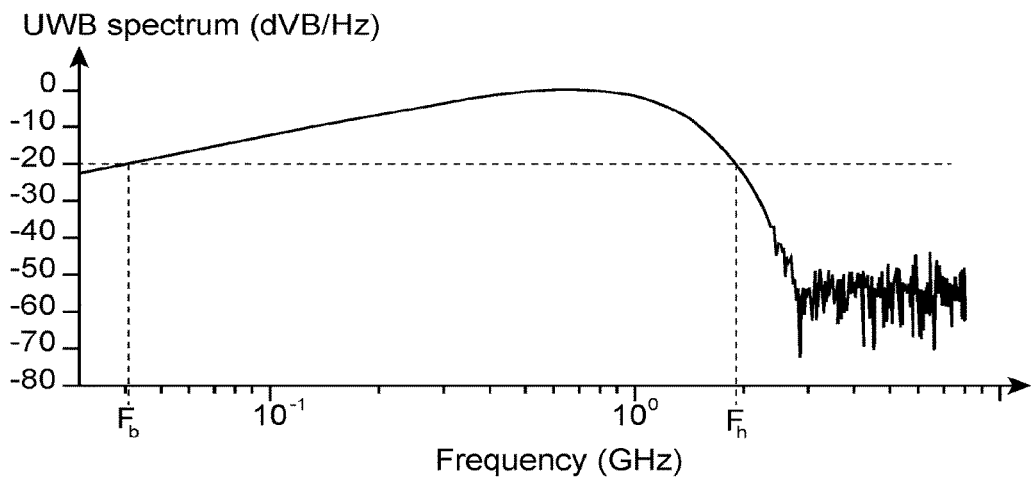

FIG. 1c represents the spectrum of an ultra wide band signal.

The frequency coverage of the ultra wide band signal is such that the band ratio RB=Fh/Fb is greater than 10, where Fh is the high frequency of the signal and Fb is the low frequency of the signal. The band ratio RB is even higher than the rise time Tm is low.

According to one preferred embodiment shown in FIG. 2, the ultra wide band signal detection device according to the invention includes the following elements.

The ultra wide band signal detection device comprises one or several ultra wide band signal reception antennas 1. For example, it may be a monopole antenna. FIG. 2 shows a single antenna, but the device can include several antennas to make it independent of the direction of the signal to be detected and the orientation of the electric field.

The output from antenna 1 is connected to the input of a limiter 2 that protects electronic components downstream. The limiter clips the signal received by the antenna 1 above a predetermined threshold. Thus, the limiter 2 produces a limited signal at its output with an amplitude compatible with protection of electronic components downstream.

The output of the limiter 2 is connected to the input of a power divider 3 that distributes the signal that it receives identically on several parallel channels. In the example shown, the power divider 3 has four outputs, as an example.

Each output is connected to a respective branch. The branches are similar.

One branch comprises a respective attenuator $4_1$, $4_2$, $4_3$ and $4_4$ that assures that the signal amplitude is compatible with electronic components downstream.

The output of each attenuator $4_1$, $4_2$, $4_3$ and $4_4$ is connected to the input of a respective passband filter $5_1$, $5_2$, $5_3$ and $5_4$.

Each passband filter $5_1$, $5_2$, $5_3$ and $5_4$ divides the spectral content of the signal that it receives into a respective sub-band. The sub-bands are adjacent and the combination of all the sub-bands covers the frequency range of the ultra wide band signal to be detected. For example, filter $5_1$ correspond to the 0 to 0.1 GHz sub-band, filter $5_2$ corresponds to the 0.1 to 0.5 GHz sub-band, filter $5_3$ corresponds to the 0.5 to 1 GHz sub-band and filter $5_4$ corresponds to the 1 to 3 GHz sub-band. There can be a small overlap between sub-bands.

The output of each passband filter $5_1$, $5_2$, $5_3$ and $5_4$ is connected to the input of a respective logarithmic amplifier $6_1$, $6_2$, $6_3$, and $6_4$ that outputs the signal envelope in a respective sub-band defined by the passband filter $5_1$, $5_2$, $5_3$ and $5_4$.

It should be noted that the response time of logarithmic amplifiers in the lowest frequency bands is compatible with the detection of UWB type signals.

The output of each logarithmic amplifier $6_1$, $6_2$, $6_3$ and $6_4$ is connected to the input to a respective analogue/digital converter $7_1$, $7_2$, $7_3$, and $7_4$ that outputs a digital signal representative of the envelope of the signal in a respective sub-band.

The output of each analogue/digital converter $7_1$, $7_2$, $7_3$ and $7_4$ is connected to a respective input of a calculation module 8.

The calculation module 8 is a programmable microcomputer that has calculation and memory capabilities. For example, it may be an FPGA type component.

The calculation module 8 receives signals output from analogue/digital converters $7_1$, $7_2$, $7_3$ and $7_4$ and determines whether or not the received signal is a UWB signal. To achieve this, the amplitude and duration of the signal received in each frequency sub-band are determined. A signal is detected as being an ultra wide band signal if the amplitudes in each of the frequency sub-bands are high simultaneously and if the total duration of the detected signal is of the order of 10 to 20 nanoseconds. This approach overcomes difficulties related to the rise time of the detection component. The following description gives details of operation of the calculation module 8.

The output from calculation module 8 is connected to an alarm module 9. The calculation module 8 transmits an information signal to the alarm module 9 if the signal received by the detection device is of the UWB type. The alarm module 9 then issues an alarm that may be audible and/or visual. The alarm can also be an electric signal containing warning information that is sent to a remote processing system.

FIG. 3 shows the operation of the ultra wide band signal detection device, in the form of a flowchart comprising steps E1 to E5.

Step E1 is the reception of a signal S by the antenna 1.

The next step E2 is division of the received signal S into several frequency sub-bands. The sub-bands are adjacent and the combination of all the sub-bands covers the frequency range of the ultra wide band signal to be detected.

For example, the signal is divided into four frequency sub-bands SB1, SB2, SB3 and SB4.

In the next step E3, the divided signal envelope is determined for each sub-band.

The next step E4 is a comparison of the signal amplitude in each sub-band with a respective predetermined amplitude threshold SA1, SA2, SA3 and SA4, and a comparison of the total duration of the detected signal with a predetermined time threshold ST. The time threshold is the same for all sub-bands and may for example be equal to 10 nanoseconds.

If the amplitude of the signal detected in each sub-band is greater than the amplitude threshold SA and if the total duration of the detected signal is less than the time threshold ST, then the detected signal S is identified as being of the ultra wide band type.

Preferably, a detected UWB signal is also compared with reference UWB signals stored in the calculation module 8. These reference UWB signals are determined during a learning phase that will be described below. They form signals typical of the normal electromagnetic environment of the device. If the detected signal is similar to a reference UWB signal, it is not considered to be an alarm generator.

The comparison is made on a number of criteria, for example the measured amplitude in each sub-band, the duration, the repetition ratio, and the event time and date. A user will preferably be able to configure all or at least some of these criteria.

Error margins can also be configured by the user, and are taken into account for each comparison made.

If the detected signals are repetitive events, the minimum, maximum and average amplitudes and durations and any other statistic that can be deduced from them (standard deviation, etc.) can be used.

Comparison and/or discrimination criteria can be formed from the envelope: slope of the first rising front, decay time, decay shape. The calculation module determines these data from the recorded envelope. Several of these criteria may be necessary. Criteria are valid for all sub-bands.

In all cases, the characteristics of the detected UWB signal are recorded so that a log of the electromagnetic environment of the detection device can be created.

The next step E5 is to send an alarm when the detected signal S is identified as being of the ultra wide band type, and if applicable, different from the reference signals in the previous step. The alarm is emitted by the alarm module 9. It may be an audible and/or visible alarm. The alarm can also be an electric signal containing warning information that is sent to a remote processing system.

FIG. 4 shows a learning phase of the ultra wide band signal detection device, in the form of a flowchart comprising steps E10 to E11.

Learning takes place when the device is started for the first time. It may also be necessary occasionally during use of the detection device.

Step E10 records signals detected in each frequency sub-band for a predetermined duration that may vary from several seconds to several hours. This is done using steps E1 to E4 described above. If UWB signals are detected during the learning phase, it is considered that they form part of the normal electromagnetic environment of the device. They are reference signals.

The next step E11 stores the characteristics of reference signals in the calculation module 8.

The characteristics stored are characteristics that will be used in the subsequent comparison step E4.

Preferably, several UWB signal detectors are used in an installation to be monitored. Detectors are then located at sufficient intervals from each other, for example about ten meters, and are perfectly synchronised by their calculation modules. As a variant, synchronisation is also possible using a GPS chip capable of giving a good time reference. The GPS chip is a complementary component connected to or integrated into the calculation module 8.

The invention claimed is:

1. A device for the detection of an ultra wide band signal, comprising:
   a signal reception circuit,
   a signal divider circuit to divide the received signal into several frequency sub-bands,
   a circuit to determine the amplitude and duration of the signal received in each frequency sub-band,
   a circuit to compare the amplitude of the signal received in each frequency sub-band with an amplitude threshold,
   a circuit to compare the duration of the signal received in each frequency sub-band with a time threshold, and
   a decision circuit that determines that the received signal is of the ultra wide band type if the amplitude of the signal received in each frequency sub-band is higher than the amplitude threshold and if the duration of the signal received in each frequency sub-band is less than the time threshold.

2. The device for the detection of an ultra wide band signal according to claim 1, comprising an alarm circuit to signal that the received signal is of the ultra wide band type.

3. The device for the detection of an ultra wide band signal according to claim 1, comprising a circuit to store the detected ultra wide band type signal.

4. The device for the detection of an ultra wide band signal according to claim 1, comprising a circuit to determine the envelope of the signal received in each frequency sub-band.

5. The device for the detection of an ultra wide band signal according to claim 1, wherein it is adapted to implement a learning phase during which detected ultra wide band type signals are stored as reference signals.

6. The device for the detection of an ultra wide band signal according to claim 5, wherein the decision circuit is adapted to compare a detected ultra wide band type signal with the reference signals.

7. A method of detecting an ultra wide band signal, comprising:
   reception of the signal,
   division of the received signal into several frequency sub-bands,
   determination of the amplitude and duration of the signal received in each frequency sub-band,
   comparison of the amplitude of the signal received in each frequency sub-band with an amplitude threshold,
   comparison of the duration of the signal received in each frequency sub-band with a time threshold, and
   decision to determine that the received signal is of the ultra wide band type if the amplitude of the signal received in each frequency sub-band is higher than the amplitude threshold and if the duration of the signal received in each frequency sub-band is less than the time threshold.

8. A computer program containing instructions for execution of the steps in the method according to claim 7 when said program is executed by a computer.

9. A storage medium that can be read by a computer, in which a computer program is stored containing instructions for execution of the steps in the method according to claim 7.

10. A method of detecting whether a signal is an ultra wide band signal, comprising:
- receiving the signal,
- dividing the received signal into several frequency sub-bands,
- determining a duration of the signal received in each frequency sub-band,
- comparing the duration of the signal received in each frequency sub-band with a time threshold,
- determining the amplitude of the signal in each of the frequency bands, and
- determining whether the signal is the received signal is of the ultra wide band type if the amplitude of the signal received in each frequency sub-band is at a high level and if the duration of the signal received in each frequency sub-band is less than the time threshold.

11. The method of detecting an ultra wide band signal according to claim 10, wherein determining whether the signal is the received signal is of the ultra wide band type comprises:
- determining the amplitude of the signal over a frequency range of the signal to be detected, the frequency range having a low frequency and a high frequency, and
- determining whether the amplitude of the signal in each frequency band is higher than a threshold determined using an amplitude of the signal at the low and high frequencies.

* * * * *